| United States Patent [19] | [11] Patent Number: 4,987,056 |
| Imahashi et al. | [45] Date of Patent: Jan. 22, 1991 |

[54] PHOTOPOLYMERIZABLE COMPOSITION

[75] Inventors: Satoshi Imahashi; Atsushi Saito; Katuhiro Yamashita, all of Shiga, Japan

[73] Assignee: Toyo Boseki Kabushiki Kaisha, Osaka, Japan

[21] Appl. No.: 360,831

[22] Filed: Jun. 2, 1989

[30] Foreign Application Priority Data

Jun. 2, 1988 [JP] Japan ............................... 63-136272
Oct. 22, 1988 [JP] Japan ............................... 63-266654
Dec. 10, 1988 [JP] Japan ............................... 63-312748

[51] Int. Cl.$^5$ .................. G03F 7/029; C08F 4/10; C08F 4/16; C08F 4/26
[52] U.S. Cl. ...................... 430/281; 522/14; 522/26; 522/28; 430/914; 430/915; 430/916
[58] Field of Search .............. 430/915, 916, 914, 281; 522/14, 26, 28

[56] References Cited

U.S. PATENT DOCUMENTS

| 3,717,558 | 2/1973 | McGinniss | 522/29 |
| 4,162,162 | 7/1979 | Dueber | 430/288 |
| 4,278,751 | 7/1981 | Specht et al. | 430/281 |
| 4,367,280 | 1/1983 | Kondo et al. | 522/28 |
| 4,548,891 | 10/1985 | Riediker et al. | 430/287 |
| 4,707,432 | 11/1987 | Gatechair et al. | 430/914 |
| 4,713,401 | 12/1987 | Riediker et al. | 430/286 |
| 4,740,577 | 4/1988 | DeVoe et al. | 522/28 |
| 4,849,320 | 7/1989 | Irving et al. | 430/281 |
| 4,868,092 | 9/1989 | Kawabata et al. | 430/914 |

FOREIGN PATENT DOCUMENTS

| 152377 | 8/1985 | European Pat. Off. | 522/28 |
| 54-155292 | 12/1979 | Japan . | |
| 56-004604 | 1/1981 | Japan . | |
| 58-15503 | 1/1983 | Japan . | |
| 61-97650 | 5/1986 | Japan . | |
| 61-123603 | 6/1986 | Japan . | |

*Primary Examiner*—Marion C. McCamish
*Assistant Examiner*—Christopher D. RoDee
*Attorney, Agent, or Firm*—Wegner, Cantor, Mueller & Player

[57] ABSTRACT

A photopolymeric composition having improved sensitivity to a visible light ray which comprises:

(a) at least one ethylenic unsaturated compound which is non-gaseous at a normal temperature;
(b) at least one metallic arene compound;
(c) a compound selected from the group consisting of p-aminophenyl unsaturated detone compounds, pyridine derivatives or salts thereof, xanthene or thioxanthene compounds and mixtures thereof; and optionally
(d) a compound selected from the group consisting of phenylglycine derivatives, cyclic diketone compounds and mixtures thereof.

5 Claims, No Drawings

PHOTOPOLYMERIZABLE COMPOSITION

FIELD OF THE INVENTION

The present invention relates to a novel photopolymerizable composition having sensitivity up to a visible light range.

BACKGROUND OF THE INVENTION

Photopolymerizable compositions have been used for various purposes. For example, they are used for printing, copying, resist formation and the like, commercially.

In general, these compositions contain ethylenic unsaturated compounds or other types of polymerizable compounds, photopolymerization initiators or photopolymerization initiator systems and, preferably, solvent-soluble or water or alkali-soluble organic polymer binder compounds. However, the application of many of these known and useful photopolymerizable compositions is restricted because most of the initiators used are activated only by an ultraviolet range of a spectrum.

Further, as a technique for image formation, it is demanded that a visible light ray is used as a light source in place of an ultraviolet ray, or an exposure to light is carried out by scanning with a laser which has a large oscillation strength at a visible light range, for example, an argon ion laser. Accordingly, a photopolymerizable material having high sensitivity to a visible light ray is demanded and, thereby, a photopolymerization initiator having high sensitivity to a visible light ray is required.

As improved photopolymerization initiator systems, there are disclosed a system containing hexaarylbisimidazole in Japanese Patent Kokai No. 292, corresponding to U.S. Pat. No. 4,162,162; a system of an active halogen and 3-keto substituted cumarin compound in Japanese Patent Kokai No. 58-15503, corresponding to U.S. Pat. No. 4,505,793; a system of 3-keto substituted cumarin and N-phenylglycine in Japanese Patent Kokai No. 56-460, corresponding to U.S. Pat. No. 4,278,751 a combination of 3-substituted cumarin and a quinazolinone derivative in Japanese Patent Kokai No. 61-97650 and hexaarylbisimidazole and 3-keto substituted cumarin in Japanese Patent Kokai No. 61-123603.

However, the above photopolymerization initiator systems do not have sufficient sensitivity and, therefore, for exposure to light at a high speed by means of a low power laser it is required to find a more sensitive photopolymerization initiator.

OBJECTS OF THE INVENTION

The main object of the present invention is to further improve sensitivity of a photopolymerizable composition up to a visible light ray.

This object as well as other objects and advantages will become apparent to those skilled in the art from the following description.

SUMMARY OF THE INVENTION

According to the present invention, there is provided a photopolymerizable composition which comprises:
(a) at least one ethylenic unsaturated compound which is non-gaseous at room temperature;
(b) at least one metallic arene compound of the general formula (I):

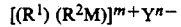

$$[(R^1)(R^2M)]^{m+} Y^{n-} \quad (I)$$

m and n are an integer of 1 or 2, $R^1$ is $\pi$-arene, $R^2$ is $\pi$-arene or an anion of $\pi$-arene, M is a monovalent to trivalent metallic cation of the IVb to VIIb group, VIII group or Ib group of the periodic table, and Y is an anion selected from the group consisting of $BF_4^-$, $PF_6^-$, $AsF_6^-$, $SbF_6^-$, $FeCl_4^-$, $SnCl_6^-$, $SbCl_6^-$ and $BiCl_6^-$; and (c) at least one compound selected from the group consisting of a p-aminophenyl unsaturated ketone compound of the general formula (II):

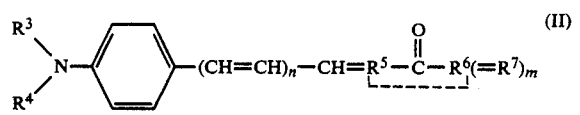

wherein m and n are 0 or 1, $R^3$ and $R^4$ are hydrogen atom or an alkyl group having 1 to 6 carbon atoms, or $CH_2COOR^8$ (wherein $R^8$ is hydrogen atom or an alkyl group having 1 to 6 carbon atoms, an alkaline metal, ammonium or an amine), or $C_2H_4CF_3$, $C_2H_4I$, $C_2H_4Br$, $C_2H_4Cl$, $C_2H_4F$, $C_2H_4CN$ or $C_2H_4NO_2$, $R^5$ is methylidine or an alkylene-iridin group having 1 to 6 carbon atoms which may combine with $R^6$ and form a ring together with the carbonyl group, $R^6$ is carbon atom, an unsubstituted phenyl group or a substituted phenyl group with a substituent selected from amino, N-alkylamino having 1 to 6 carbon atoms, N,N dialkylamino having 1 to 6 carbon atoms, hydroxy, alkoxy having 1 to 6 carbon atoms, alkylthio having 1 to 6 carbon atoms, aryl having 6 to 14 carbon atoms exemplified by phenyl and naphthyl optionally substituted with alkyl groups of 1 to 4 carbon atoms or mercapto, or a group which forms indanone or tetralone together with $R^5$ and the carbonyl group, and $R^7$ is:

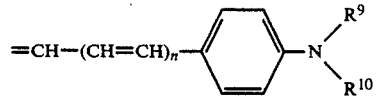

(wherein n is 0 or 1, and $R^9$ and $R^{10}$ are hydrogen atom or an alkyl group having 1 to 6 carbon atoms or $CH_2COOR^{11}$ (wherein $R^{11}$ is hydrogen atom, an alkyl group having 1 to 6 carbon atoms, an alkaline metal, ammonium, or an amine), or $C_2H_4CF_3$, $C_2H_4I$, $C_2H_4Br$, $C_2H_4Cl$, $C_2H_4F$, $C_2H_4CN$ or $C_2H_4NO_2$), a pyridine derivative of the general formula (III):

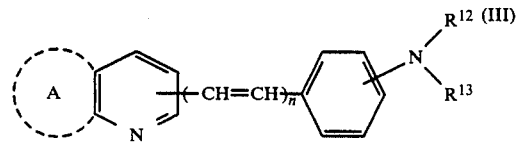

wherein n is 1 or 2, and $R^{12}$ and $R^{13}$ are an alkyl group having 1 to 6 carbon atoms and A is an optionally present aryl group, which can be condensed to the pyridine ring to form a quinoline ring, or a salt thereof, and
a xanthene or thioxanthene compound of the general formula (IV):

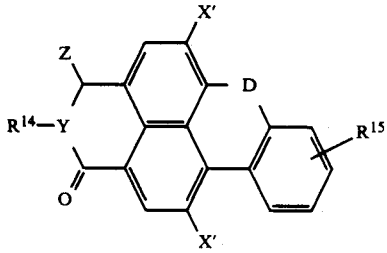

wherein D is oxygen atom or sulfur atom, X' is hydrogen atom or halogen atom, Y is carbon atom or nitrogen atom, provided that, when Y is carbon atom, Y is bonded to the adjacent carbon atom through a double bonding (the dotted line part) and, when Y is nitrogen atom, Y is bonded to the adjacent carbon atom through a single bond, Z is oxygen atom (in this case, Z is bonded to the adjacent carbon atom through a double bond), an alkoxy group having 1 to 6 carbon atoms or an alkanoyloxy group having 1 to 6 carbon atoms, $R^{14}$ is an alkyl group having 1 to 6 carbon atoms, a hydroxyalkyl group having 1 to 6 carbon atoms, an alkoxyalkyl group having 2 to 12 carbon atoms, a dialkylaminoalkyl group having 3 to 18 carbon atoms, or an aryl group of 6–14 carbon atoms, exemplified by phenyl and naphthyl optionally substituted with alkyl groups of 1–4 carbon atoms, and $R^{15}$ is hydrogen atom, an alkoxy group having 1 to 6 carbon atoms, an alkyl group having 1 to 6 carbon atoms or a dialkylamino group having 1 to 6 carbon atoms.

Optionally, the photopolymerizable composition of the present invention further includes:

(d) at least one compound selected from the group consisting of a compound of the general formula (V):

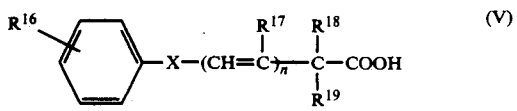

wherein $R^{16}$, $R^{18}$ and $R^{19}$ are the same or different and are hydrogen, an alkyl group having 1 to 6 carbon atoms, an alkoxy group having 1 to 6 carbon atoms, cyano, carboxylic acid alkyl ester wherein the alkyl group has 1 to 4 carbon atoms, carboxylic acid alkyl amide wherein the alkyl group has 1 to 4 carbon atoms, nitro or halogen, or $R^{16}$ may form a condensed polycyclic group together with the benzene ring (e.g., naphthalene ring, etc.), X is S, Se or N-$R^{20}$, $R^{20}$ is hydrogen or an alkyl group having 1 to 6 carbon atoms, $R^{17}$ is hydrogen, an alkyl group having 1 to 6 carbon atoms or phenyl or $R^{17}$—(C=CH)$_n$—X— may form a 5 membered ring condensed with the benzene ring (e.g., indole ring, etc.), and n is 0 or 1, and a cyclic diketone compound of the general formula (VI):

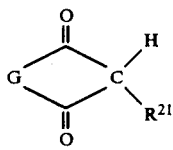

wherein $R^{21}$ is hydrogen, a substituted or unsubstituted alkyl group having 1 to 12 carbon atoms or an aralkyl group of 7–20 carbon atoms the aryl moiety of which has 6 to 10 carbon atoms (e.g., phenyl or naphthyl), and the alkyl moiety of which has 1 to 10 carbon atoms and wherein the aryl moiety is optionally substituted with alkyl of 1 to 4 carbon atoms, G is a bivalent organic group.

Where $R^6$ is a substituted phenyl group, the substituent is amino, N-alkylamino having 1 to 6 carbon atoms, N,N-dialkylamino wherein the alkyl groups have 1 to 6 carbon atoms, hydroxy, alkoxy of 1 to 6 carbon atoms, 1 to 6 carbon alkylthio, mercapto and $C_6$–$C_{14}$-aryl such as phenyl or naphthyl optionally substituted with alkyl of 1 to 4 carbon atoms.

DETAILED DESCRIPTION OF THE INVENTION

The ethylenic unsaturated compound used in the present invention is a monomer suitable for a chain growth addition reaction initiated by a free radical. Examples thereof include pentaerythritol triacrylate, polyethylene glycol diacrylate, triethylene glycol diacrylate, polyethylene glycol dimethacrylate, tetraethylene glycol dimethacrylate, trimethylolpropane triacrylate, trimethylolpropane trimethacrylate and the like. They can be used alone or in combination thereof.

The second component (b) is a metallic arene compound represented by the general formula (I). Examples thereof include metallic arene compounds disclosed in EP-A 94914, EP-A 109851 and EP-A 152377 as photocationic polymerization initiators. As $\pi$-arene of $R^1$ and $R^2$, for example, there are aromatic groups having 6 to 24 carbon atoms and hetero aromatic groups having 3 to 30 carbon atoms, and these groups may be mononuclear, condensed polynuclear or uncondensed polynuclear groups. They may be unsubstituted, or may be monosubstituted or polysubstituted with the same or different substituents, for example, an alkyl group having 1 to 12 carbon atoms, an alkenyl group having 2 to 12 carbon atoms, an alkynyl group having 2 to 12 carbon atoms, an alkoxy group having 1 to 8 carbon atoms, cyano group, an alkylthio group having 1 to 6 carbon atoms, phenoxy group, a monocarboxylic acid group having 2 to 6 carbon atoms or its ester or amide group, phenyl group, alkanoyl group having 2 to 5 carbon atoms, ammonium group, pyridinium group, nitro group, alkylsufinyl group having 1 to 6 carbon atoms, alkylsulfonyl group having 1 to 6 carbon atoms and sulfamoyl group having 2 to 5 carbon atoms; halogen atom (e.g., chlorine, bromine, fluorine, iodine, etc.) and the like.

As the metallic arene compound, that having a small reduction potential is preferred because it provides high sensitivity to the photopolymerizable compound. Accordingly, the compound having an electron attractive substituent or a polycyclic group is particularly preferred. Examples of suitable $\pi$-arene include benzene, toluene, xylene, ethylbenzene, dimethoxybenzene, p-chlorotoluene, chlorobenzene, bromobenzene, acetylbenzene, benzoic acid, ethyl benzoate, naphthalene, chloronaphthalene, bromonaphthalene, pyrene, naphthacene, thiophene, chromen, benzothiophene, xanthene, thioxanthene, carbazole and the like. As the anion of $\pi$-arene of $R^2$, there are anions of the above $\pi$-arenes, for example, indenyl anion and, particularly, cyclopentadienyl anion, and these anions may be unsubstituted or may be monosubstituted or polysubstituted with the same or different substituents as described above. In this case, an electron attractive substituent is particularly preferred. Examples bf suitable anions of π-arene include anion of cyclopentadiene, anions of methyl-, ethyl-, n-propyl- and n-butylcyclopentadiene, anion of dichlorocyclopentadiene, anions of cyclopentadiene carboxylic acid and alkyl esters thereof and anions of acetylcyclopentadiene, cyclocyclopentadiene and benzoylcyclopentadiene.

M is a monovalent to trivalent metallic cation of from the IVb to VIIb group, VIII group or Ib group of the periodic table, for example, titanium, zirconium, hafnium, vanadium, niobium, chrome, molybdenum, tungsten, manganese, rhenium, iron, cobalt, nickel, copper and the like. Chromium, cobalt, manganese, tungsten, iron and molybdenum are preferred. Particularly, a cation of iron is most preferred.

Examples of Y include $BF_4^-$, $PF_6^-$, $AsF_6^-$, $SbF_6^-$, $FeCl_4^-$, $SnCl_6^{2-}$, $SbCl_6^-$, $BiCl_6^-$ and the like. Most preferable anion is $SbF_6^-$, $BF_4^-$, $AsF_6^-$ and $PF_6^-$.

The compound of the formula (I) can be synthesized according to a known method. Particularly, as iron arene compounds, many kinds of compounds are disclosed in Chemiker-Zeitung, 108 (11) 345–354 (1984).

Examples of such compounds include ($\eta^6$-benzene)($\eta^5$-cyclopentadienyl)iron(II) hexafluorophosphate, ($\eta^6$-toluene)($\eta^5$-cyclopentadienyl)iron(II) hexafluorophosphate, ($\eta^6$-cumene)($\eta$-cyclopentadienyl)iron(II) hexafluorophosphate, ($\eta^6$-benzene)($\eta^5$-cyclopentadienyl)iron(II) tetrafluoroborate, ($\eta^6$-naphthalene)($\eta^5$-cyclopentadienyl)iron(II) hexafluorophosphate, ($\eta^6$-anthracene)($\eta^5$-cyclopentadienyl)iron (II) hexafluorophosphate, ($\eta^6$-pyrene)($\eta^5$-cyclopentadienyl)iron(II) tetrafluoroborate, ($\eta^6$-benzene) ($\eta^5$-cyanocyclopentadienyl)iron(II) hexafluorophophate, ($\eta^6$-cumene)($\eta^5$-chlorocyclopentadienyl)iron(II) tetrafluoroborate, ($\eta^6$benzene) ($\eta^5$-carboethoxycyclohexadienyl)iron(II) hexafluorophosphate, ($\eta^6$-benzene)($\eta^5$-1,3-dichlorocyclohexadienyl)iron(II) hexafluorophosphate, ($\eta^6$-cyanobenzene)($\eta^5$-cyclohexadienyl)iron(II) hexafluoro-phosphate, ($\eta^6$-acetophenone)($\eta^5$-cyclopentadienyl)iron(II) hexafluorophosphate, ($\eta^6$-benzenesulfonamide) ($\eta^5$-cyclopentadienyl)iron(II) tetrafluoroborate, ($\eta^6$-chloronaphthalene)($\eta^5$-cyclopentadienyl)iron(II) hexafluorophosphate, ($\eta^6$-anthracene)($\eta^5$-cyanocyclopentadienyl)iron(II) hexafluorophosphate and the like. These compounds can be synthesized according to a method disclosed in Dokl. Akd. Nauk SSSR, 149, 615 (1963).

Examples of the other metal arene compounds include ($\eta^6$-benzene)($\eta^5$-cyclopentadienyl)cobalt(III) bis(tetrafluoroborate), ($\eta^6$-benzene)($\eta^5$-cyclopentadienyl)cobalt(II) hexafluorophosphate, ($\eta^6$-cyanobenzene)($\eta^5$-cyclopentadienyl)cobalt(II) tetrafluoroborate, bis($\eta^5$-cyclopentadienyl)cobalt(III) hexafluorophosphate, bis($\eta^5$-chlorocyclopentadienyl)nickel(II) hexafluoroantimonate, ($\eta^7$-cycloheptatrienyl) ($\eta^5$-cyclopentadienyl)manganese(III) hexafluorophosphate, ($\eta^8$-cyclooctatetrenyl)($\eta^5$-cyclopentadienyl)chrome(III) hexafluorophophate and the like.

The compounds of the component (b) can be used alone or in combination thereof.

Examples of p-aminophenyl unsaturated ketone compound as the third component (c) represented by the general formula (II) include 2,5-bis(4'-diethylaminobenzylidene)cyclopentanone, 2,5-bis(4'-dimetylaminobenzylidene)cyclopentanone, 2,6-bis(4 -diethylaminobenzylidene)cyclohexanone, 2,6-bis(4 -dimethylaminobenzylidene)cyclohexanone, 2,5-bis(4'-dimethylaminocinzylidene)cyclopentanone, 2,5-bis(4'-dimethylaminocinnamylidene)cyclopentanone, 2,6-bis(4'-dimethylaminocinnamylidene)cyclohexanone, 1,3-bis(4'-dimethylaminobenzylidene)acetone, 2-(4'-diethylaminobenzylidene)-1-indanone, 2 (9'-durolylidene)-1-indanone, 2-(4'-diethyl-aminobenzylidene)-1-tetralone, 4'-diethylamino-2'-methylbenzylideneacetophenone, 2,5-bis(4'-N-ethyl-N-carbomethoxymethylaminobenzylidene)cyclopentanone, 2,5-bis(4'-N-ethyl-N-carboxymetylaminobenzylidene) pentanone and sodium salt thereof, 2,5-bis(4'-N-methyl-N-cyanoethylaminobenzylidene)cyclopentanone, 2,5-bis(4'-N-ethyl-N-chloroethylaminocinnamylidene)cyclopentanone, 2,6-bis(4'-N-cyanoethylaminobenzylidene)cyclohexanone, 2-(4'-N-ehtyl-N-carboxymethylaminobenzylidene)-1-indanone, sodium salt of 2-(4'-N-ethyl-N-carboxymethylaminobenzylidene)-1-tetralone, 2-((4'-ethyl-N-cyanoethylaminobenzylidene)-1-indanone and the like.

Particularly preferred compounds are p-aminophenyl compound of the formula (II) wherein at least one of $R^3$, $R^4$, $R^9$ and $R^{10}$ is $CH_2COOR^{11}$ (wherein $R^{11}$ is alkyl group having 1 to 6 carbon atoms), $CH_2COOH$ or alkaline metal salt, ammonium salt or amine salt thereof, or $C_2H_4CF_3$, $C_2H_4I$, $C_2H_4Cl$, $C_2H_4F$, $C_2H_4CN$ or $C_2H_4NO_2$.

Examples of the pyridine derivative conjugated with a dialkylaminophenyl group as the third component (c) represented by the general formula (III) include 4-(p-dimethylaminostyryl)pyridine, 4-(p-diethylaminostyryl)pyridine, 2-(p-dimethylaminostyryl)pyridine, 2-(p-diethylaminostyryl)pyridine, 4-(p-dimetylaminostyryl)quinoline, 4-(p-diethylaminostyryl)quinoline, 2-(p-dimethylaminostyryl)quinoline, 2-(p-diethylaminostyryl)quinoline, 2-(p-diethylaminostyryl)-6-ethoxyquinoline, 4-(p-dimethylaminostyryl)pyridinium hydrochloride, 4-(p-dimethylaminostyryl)quinolinium hydrobromide, 2-(p-dimethylaminostyryl) quinolinium hexafluorophosphate and the like.

Examples of the xanthene or xanthene compound as the third component (c) represented by the general formula (IV) include those wherein X' is hydrogen, chlorine, bromine or the like, Z is methoxy, ethoxy, propoxy, acetyloxy, propionyloxy or the like, $R^{14}$ is methyl, ethyl, propyl, hydroxymethyl, hydroxyethyl, methoxymethyl, methoxyethyl, dimethylaminomethyl, diethylaminopropyl, phenyl, xylyl, tolyl, anisyl or the like, $R^{15}$ is hydrogen, methoxy, ethoxy, methyl, ethyl, propyl, dimethylamino, diethylamino or the like.

The compounds of the component (c) can be used alone or in combination thereof.

In the present invention, when the compounds represented by the formulas (V) and/or (VI) of the component (d) are added, sensitivity of the composition is further improved. Examples of the compound represented by the general formula (V) include N-phenylglycine, N-(p-methylphenyl)glycine, N-(p-methoxyphenyl)glycine, N-(p-cyanophenyl)glycine, N-(p-chlorophenyl)glycine, N-methyl-N-phenylglycine, indoleacetic acid, N-methylindoleacetic acid, 6-cyanoindoleactic acid and the like.

The cyclic diketone compound represented by the general formula (VI) is a cyclic β-dicarbonyl compound having an active methylene group with an unstable hydrogen atom. In the formula (VI), $R^{21}$ is hydrogen, an unsubstituted or substituted alkyl group or aralkyl group of 7 to 20 carbon atoms and G is a bivalent organic group which may contain one or more hetero atoms and may contain one or more substituents on either or both carbon and hetero atoms thereof. The above alkyl group is that having 1 to 12 carbon atoms and, as the substituted alkyl, for example, there are hydroxylalkyl, cyanoalkyl, haloalkyl, alkoxyalkylene, alkylenethioether, aryloxyalkylene and the like. The aryl hydrocarbon moiety of the above aralkyl has 6 to 10 carbon atoms and is exemplified by phenyl or naphthyl. The above bivalent organic group G completes the ring shown. This part may contain one or more hetero atoms, for example, nitrogen, oxygen and sulfur. Examples of these compounds include 5,5 -dimethyl-1,3-cyclohexanedione, 2-methyl-1,3-cyclohexanedione, 2-methyl-1,3-cyclopentadione, 2,4-diethyl-1,3-cyclobutanedione, 2-methyl-1,3-cyclobutanedione, 5-methyl-2-thiobarbituric acid, barbituric acid, 3-ethyltetronic acid, 2,4-dimethyl-3-oxo-5-hydroxy-5-methoxypentenoic acid 8-lactone, 1,3,5-trimethylbarbituric acid, 1,3-dimethyl-5-ethylbarbituric acid, 2-methyldimedone, 1,3-indanedione, 2-methylindanedione, bis-[5-(1,3-dimethyl-barbituryl)]methane, 1,5-diphenyl-3-[2-(phenylthio) ethyl]-2,4-pyrrolidinedione, 1-phenyl-3,5-diketo-4-n-butyltetrahydropyrazole, 2,2-dimethyl-m-dioxane-4,6-dione, 2,2,5-trimethyl-m-dioxane-4,6-dione and the like.

Preferably, a thermoplastic polymeric organic binder can be contained in the composition of the present invention. Examples of such a polymeric binder include (i) copolyesters composed of terephthalic acid, isophthalic acid, sebasic acid, adipic acid and hexahydroterephthalic acid, (ii) polyamides, (iii) vinylidene chloride copolymers, (iv) ethylene/vinylacetate copolymers, (v) cellulose ethers, (vi) polyethylene, (vii) synthetic rubbers, (viii) cellulose esters, (ix) polyvinyl esters containing polyvinyl acetate/acrylate and polyvinyl acetate/methacrylate copolymers, (x) polyacrylate and poly α-alkyl acrylate esters, for example, polymethyl methacrylate and polyethyl methacrylate, (xi) high molecular weight ethylene oxide polymers having weight average molecular weight of 4,000 to 4,000,000 (polyethylene glycols), (xii) polyvinyl chloride and copolymers thereof, (xiii) polyvinyl acetal, (xiv) polyformaldehyde, (xv) polyurethane, (xvi) polycarbonate, (xvii) polystyrene and the like.

In the most preferred embodiment of the present invention, the photopolymerizable binder is selected so that, although a photopolymerizable coating is predominantly soluble in an aqueous solution, for example, alkaline solution, it becomes realtively insoluble in such a solution after exposure to active ray radiation. Typically, the polymer which satisfies these requirements is a carboxylated polymer, for example, a vinyl addition polymer containing free carboxylic acid group. As the preferable binder, for example, there are styrene/maleic anhydride (1:1) copolymer having the acid value of about 190 and the weight average molecular weight of about 10,000 which is partially esterified with an isobutanol mixture, and the combination of styrene/maleic anhydride copolymer and ethyl acrylate/methyl methacrylate/acrylic acid terpolymer. As other preferred binders, for example, there are polyacrylate esters and poly α-alkylacrylate esters, particularly, polymethyl methacrylate.

In the composition of the present invention, other known inert additives, for example, non-polymerizable plasticizers, pigments, fillers and the like can be added so far as they do not interfere with exposure of the photopolymerizable composition to light.

The photopolymerizable composition of the present invention preferably contains 0.01 to 50 parts by weight, particularly, 0.1 to 30 parts by weight of the component (b) and 0.01 to 20 parts by weight, particularly, 0.1 to 20 parts by weight of the component (c) per 100 parts by weight of the component (a). When the component (d) is used, the preferred amount thereof is 0.01 to 20 parts by weight, particularly, 0.1 to 20 parts by weight per 100 parts by weight of the component (a). The binder is preferably used in an amount of 0 to 1,000 parts, particularly, 0 to 50 parts by weight per 100 parts by weight of the component (a).

The photopolymerizable composition of the present invention can be used by coating it on various kinds of bases according to a known method.

The term "base" used herein means all natural or synthetic supports, preferably those which can be present in the form of flexible or rigid film or sheet. For example, the base may be a metallic sheet or foil, sheet or film of synthetic organic resins, cellulose paper, fiber board and the like, or a composite material of two or more of these substances. Examples of the specific base include alumina blasted-aluminum, anodized aluminum, aluminum blasted-polyethylene terephthalate film, polyethylene terephthalate film, for example, resin undercoated-polyethylene terephthalate film, electrostatic discharged-polyethylene terephthalate film, polyvinyl alcohol coated-paper, crosslinked polyester coated-paper, nylon, glass, cellulose acetate film and the like.

In general, the base is selected according to the particular purposes. For example, in the case of producing a printed circuit, the base may be a plate of fiber board on which copper has been coated. In the case of producing a litho printing plate, the base may be anodized aluminum.

Preferably, a layer of the photopolymerizable composition has a thickness of 0.0001 inch (0.00025 cm) to about 0.01 inch (0.025 cm) and is adhered to a thin flexible polymer film support (base), through which an active radiation can pass and reach the photopolymerizable layer, with a certain degree of or medium adhesion. A protective covering layer or covering sheet can be adhered on it. The latter sheet is adhered in such a degree that adhesion between it and the photopolymerizable layer is weaker than that between the film support and the photopolymerizable layer. Particularly preferred support is a transparent polyethylene terephthalate film having a thickness of about 0.001 inch (0.0025 cm) to about 0.4 inch (1.0 cm). Polyethylene having a thickness of 0.0005 inch (0.0013 cm) to 0.04 inch (0.10 cm) is a preferred covering sheet and polyvinyl alcohol coating is a preferred covering layer.

As a normal light source, for example, there are fluorescent tube, mercury vapor lamp, metal addition lamp and arc lamp which provide a narrow or wide waveband of light having mean wavelengths of 405, 436 and 546 nm (Hg). As an interference light source, for example, there are pulse type xenon, argon ion, helium-cadmium, ionized neon laser and the like. Cathode ray tube which generates a visible light ray and is widely used for a printing-out system is also useful for the composition of the present invention. In general, these sources include a phosphorescent material interior coating for generating ultraviolet or visible light rays as means for converting electric energy into photo energy and an optical fiber face plate as means for introducing radiation into a photosensitive target.

The photopolymerizable composition of the present invention has high sensitivity to a visible light ray and, therefore, a light source having a low energy can be used and a lot of printing plates can be exposed to light and developed within a given period of time.

Further, the photopolymerizable composition of the present invention has such advantages that a light source can be kept away from a printing plate and the light rays are made to be parallel. Therefore, for example, when an image contains meshes and dots, clear meshes and dots having vertical side parts can be formed.

The following Examples and Comparative Examples further illustrate the present invention in detail but are not to be construed to limit the scope thereof.

All the "parts" and "%'s" in Examples and Comparative Examples are by weight unless otherwise stated.

Examples 1 to 48 and Comparative Examples 1 to 12

A paint for a photosensitive layer of the following formulation was applied on a transparent polyethylene terephalate film of 100μ in thickness having an undercoating layer and dried at 120° C. for 1 minute using a hot-air dryer to obtain a coating film of 3μ in thickness. Then, aqueous 7% polyvinyl alcohol solution (completely saponified, polymerization degree: 500) was applied on the film and dried at 100° C. for 1 minute using a hot-air dryer to obtain an overcoated layer of 1% in thickness to obtain a sensitivity test specimen.

| Formulation of paint | |
|---|---|
| Ingredients | Parts |
| Poly(methyl methacrylate/methacrylic acid) molar ratio: 70/30 | 52 |
| Tetraethylene glycol diacrylate | 40 |
| Component (b) | 5 |
| Component (c) | 3 |
| Methanol | 200 |
| Ethyl acetate | 80 |
| Chloroform | 120 |

A 2 1/2 step tablet (gray film scale manufactured by Dainippon Screen Mfg. Co., Ltd., Japan) as a negative film was superimposed on the above sensitivity test specimen and then exposed to light at a distance of 15 cm for 5 minutes using a light source (490 nm) combined with a xenon lamp (UXL-500D-O manufactured by Ushio Electric Co., Ltd., Japan), an interference filter (KL-49 manufactured by Toshiba Co., Ltd., Japan) and the same colored glass filter Y-45. Then, the specimen was dipped in aqueous 7% sodium carbonate solution at 30° C. for 10 seconds and rinsed with water to remove the uncured portion and dried. The number of completely cured steps of the 2 1/2 step tablet was determined. The results are shown in Tables 1, 2 and Tables 4 to 7, respectively. The results of Comparative Examples are shown in Tables 3 and 8. In Tables 7 and 8, "TX-1" means the compound of the formula:

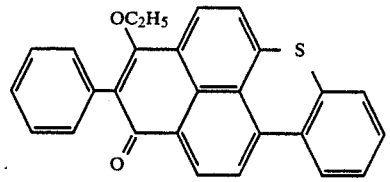

TABLE 1

| Example No. | Component (b) | Component (c) | Number of steps |
|---|---|---|---|
| 1 | (η6-cumene)(η5-cyclopentadienyl)iron(II) hexafluorophosphate | 2,5-bis(4'-diethylamino-benzylidene)cyclopentanone | 11 |
| 2 | (η6-cumene)(η5-cyclopentadienyl)iron(II) hexafluorophosphate | 2,5-bis(4'-diethylamino-benzylidene)cyclopentanone | 11 |
| 3 | (η6-cumene)(η5-cyclopentadienyl)iron(II) fluorophosphate | 2,6-bis(4'-diethylamino-benzylidene)cyclopentanone | 11 |
| 4 | (η6-cumene)(η5-cyclopentadienyl)iron(II) hexafluorophosphate | 2-(4'-diethylaminobenzylidene)-1-indanone | 10 |
| 5 | (η6-cumene)(η5-cyclopentadienyl)iron(II) hexafluorophosphate | 2-(4'-diethylaminobenzylidene)-1-tetralone | 10 |
| 6 | (η6-cumene)(η5-cyclopentadienyl)iron(II) hexafluorophosphate | 2,5-bis(4'-dibutylamino-benzylidene)cyclopentanone | 11 |
| 7 | (η6-benzene)(η5-cyclopentadienyl)iron(II) hexafluorophosphate | 2,5-bis(4'-diethylamino-benzylidene)cyclopentanone | 11 |

TABLE 2

| Example No. | Component (b) | Component (c) | Number of steps |
|---|---|---|---|
| 8 | (η6-cumene)(η5-cyclopentadienyl)iron(II) hexafluorophosphate | 2,5-bis(4'-N-ethyl-N-carbomethoxymethylaminobenzyliden)-cyclopentanone | 12 |
| 9 | (η6-cumene)(η5-cyclopentadienyl)iron(II) hexafluorophosphate | 2,5-bis(4'N-ethyl-N-carbomethoxymethylaminobenzyliden)-cyclopentanone | 14 |
| 10 | (η6-cumene)(η5-cyclopentadienyl)iron(II) hexafluorophosphate | sodium salt of 2,5-bis(4'-N-ethyl-N-carboxy-methylamino-benzylidene)cyclopentanone | 14 |

TABLE 2-continued

| Example No. | Component (b) | Component (c) | Number of steps |
|---|---|---|---|
| 11 | ($\eta^6$-cumene)($\eta^5$-cyclo-pentadienyl)iron(II) hexafluorophosphate | 2,5-bis(4'-N-ethyl-N-cyanoethyl-aminobenzylidene)cyclopentanone | 12 |
| 12 | ($\eta^6$-cumene)($\eta^5$-cyclo-pentadienyl)iron(II) hexafluorophosphate | 2,5-bis(4'-N-butyl-N-cyanoethyl-aminobenzylidene)cyclopentanone | 12 |
| 13 | ($\eta^6$-cumene)($\eta^5$-cyclo-pentadienyl)iron(II) hexafluorophosphate | 2,6-bis(4'-N-ethyl-N-carboxy-methylaminobenzylidene)cyclo-hexanone | 12 |
| 14 | ($\eta^6$-cumene)($\eta^5$-cyclo-pentadienyl)iron(II) hexafluorophosphate | 2,5-bis(4'-N-ethyl-N-carboxy-methylaminocinnamylidene)cyclo-pentanone | 14 |

TABLE 3

| Comp. Example No. | Component (b) | Component (c) | Number of steps |
|---|---|---|---|
| 1 | 2,2'-(0-chlorophenyl)-4,4',5,5'-tetraphenylbis-imidazole | 2,5-bis(4'-diethylamino-benzylidene)cyclopentanone | 6 |
| 2 | 1,3,5-tris(trichloromethyl)-S-triazine | 2,5-bis(4'-diethylamino-benzylidene)cyclopentanone | 9 |
| 3 | none | 2,5-bis(4'-diethylamino-benzylidene)cyclopentanone | 0 |
| 4 | ($\eta^6$-cumene)($\eta^5$-cyclo-pentadienyl)iron(II) hexafluorophosphate | none | 0 |

TABLE 4

| Example No. | Component (b) | Component (c) | Number of steps |
|---|---|---|---|
| 15 | ($\eta^6$-benzene)($\eta^5$-cyano-cyclopentadienyl)iron(II) hexafluorophosphate | 4-(p-diethylaminostyryl)-quinoline | 12 |
| 16 | ($\eta^6$-benzene)($\eta^5$-acetyl-cyclopentadienyl)iron(II) hexafluorophosphate | 4-(p-diethylaminostyryl)-quinoline | 12 |
| 17 | ($\eta^6$-benzene)($\eta^5$-acetyl-cyclopentadienyl)iron(II) hexafluorophosphate | 4-(p-diethylaminostyryl)-quinoline | 11 |
| 18 | ($\eta^6$-cyanobenzene)($\eta^5$-cyclopentadienyl)iron(II) hexafluorophosphate | 4-(p-diethylaminostyryl)-quinoline | 12 |
| 19 | ($\eta^6$-methylbenzoate)($\eta^5$-cyclopentadienyl)iron(II) hexafluorophosphate | 4-(p-diethylaminostyryl)-quinoline | 12 |
| 20 | ($\eta^6$-chlorobenzene)($\eta^5$-cyclopentadienyl)iron(II) hexafluorophosphate | 4-(p-diethylaminostyryl)-quinoline | 11 |
| 21 | ($\eta^6$-chlorobenzene)($\eta^5$-chlorocyclopentadienyl)iron(II) hexafluorophosphate | 4-(p-diethylaminostyryl)-quinoline | 12 |

TABLE 5

| Example No. | Component (b) | Component (c) | Number of steps |
|---|---|---|---|
| 22 | ($\eta^6$-benzene)($\eta^5$-cyano-cyclopentadienyl)iron(II) hexafluorophosphate | 2,5-bis(4'-diethylamino-benzylidene)cyclopentanone | 14 |
| 23 | ($\eta^6$-benzene)($\eta^5$-acetyl-cyclopentadienyl)iron(II) hexafluorophosphate | 2,5-bis(4'-diethylamino-benzylidene)cyclopentanone | 14 |
| 24 | ($\eta^6$-benzene)($\eta^5$-chloro-cyclopentadienyl)iron(II) hexafluorophosphate | 2,5-bis(4'-diethylamino-benzylidene)cyclopentanone | 13 |
| 25 | ($\eta^6$-cyanobenzene)($\eta^5$-cyclopentadienyl)iron(II) hexafluorophosphate | 2,5-bis(4'-diethylamino-benzylidene)cyclopentanone | 14 |
| 26 | ($\eta^6$-methylbenzoate)($\eta^5$-cyclopentadienyl)iron(II) hexafluorophosphate | 2,5-bis(4'-diethylamino-benzylidene)cyclopentanone | 14 |
| 27 | ($\eta^6$-chlorobenzene)($\eta^5$-cyclopentadienyl)iron(II)hexafluorophosphate | 2,5-bis(4'-diethylamino-benzylidene)cyclopentanone | 13 |
| 28 | ($\eta^5$-chlorobenzene)($\eta^5$-chlorocyclopentadienyl)iron | 2,5-bis(4'-diethylamino-benzylidene)cyclopentanone | 14 |

TABLE 5-continued

| Example No. | Component (b) | Component (c) | Number of steps |
|---|---|---|---|
| | (II)hexafluorophosphate | | |

TABLE 6

| Example No. | Component (b) | Component (c) | Number of steps |
|---|---|---|---|
| 29 | ($\eta^6$-cumene)($\eta^5$-cyclopentadienyl)iron(II) hexafluorophosphate | 1,1'-dicyano-4-(p-dimethylaminophenyl)-1,3-butadiene | 11 |
| 30 | ($\eta^6$-cumene)($\eta^5$-cyclopentadienyl)iron(II) hexafluorophosphate | 1,1'-dicyano-4-(p-diethylaminophenyl)-1,3-butadiene | 12 |
| 31 | ($\eta^6$-cumene)($\eta^5$-cyclopentadienyl)iron(II) hexafluorophosphate | 1,1'-dicyano-4-(o-methyl-p-dimethylaminophenyl)-1,3-butadiene | 11 |
| 32 | ($\eta^6$-benzene)($\eta^5$-cyclopentadienyl)iron(II) hexafluorophosphate | 1,1'-dicyano-4-(p-dimethylaminophenyl)-1,3-butadiene | 11 |

TABLE 7

| Example No. | Component (b) | Component (c) | Number of steps |
|---|---|---|---|
| 33 | ($\eta^6$-benzene)($\eta^5$-cyclopentadienyl)cobalt(II) hexafluorophosphate | 4-(p-diethylaminostyryl)quinoline | 8 |
| 34 | ($\eta^6$-benzene)($\eta^5$-cyclopentadienyl)cobalt(II) hexafluorophosphate | 2,5-bis(4'-diethylaminobenzylidene)cyclopentanone | 10 |
| 35 | ($\eta^6$-benzene)($\eta^5$-cyclopentadienyl)cobalt(II) hexafluorophosphate | TX-1 | 9 |
| 36 | ($\eta^6$-benzene)($\eta^5$-cyclopentadienyl)cobalt(II) hexafluorophosphate | 1,1'-dicyano-4-(p-dimethylaminophenyl)-1,3-butadiene | 8 |
| 37 | bis($\eta^5$-chloropentadienyl)nickel(II)hexafluorophosphate | 4-(p-diethylaminostyryl)-quinoline | 7 |
| 38 | bis($\eta^5$-chloropentadienyl)nickel(II)hexafluorophosphate | 2,5-bis(4'-diethylaminobenzylidene)cyclopentanone | 9 |
| 39 | bis($\eta^5$-chloropentadienyl)nickel(II)hexafluorophosphate | TX-1 | 8 |
| 40 | bis($\eta^5$-chloropentadienyl)nickel(II)hexafluorophosphate | 1,1'-dicyano-4-(p-dimethylaminophenyl)-1,3-butadiene | 6 |
| 41 | ($\eta^7$-cycloheptatrienyl)($\eta^5$-cyclopentadienyl)manganese(III)hexafluorophosphate | 4-(p-diethylaminostyryl)quinoline | 7 |
| 42 | ($\eta^7$-cycloheptatrienyl)($\eta^5$-cyclopentadienyl)manganese(III)hexafluorophosphate | 2,5-bis(4'-diethylaminobenzylidene)cyclopentanone | 9 |
| 43 | ($\eta^7$-cycloheptatrienyl)($\eta^5$-cyclopentadienyl)manganese(III)hexafluorophosphate | TX-1 | 8 |
| 44 | ($\eta^7$-cycloheptatrienyl)($\eta^5$-cyclopentadienyl)manganese(III) hexafluorophosphate | 1,1'-dicyano-4-(p-dimethylaminophenyl)-1,3-butadiene | 6 |
| 45 | ($\eta^8$-cyclooctatetrenyl)($\eta^5$-cyclopentadienyl)chrome(III) hexafluorophosphate | 4-(p-diethylaminostyryl)quinoline | 8 |
| 46 | ($\eta^8$-cyclooctatetrenyl)($\eta^5$-cyclopentadienyl)chrome(III) hexafluorophosphate | 2,5-bis(4'-diethylaminobenzylidene)cyclopentanone | 10 |
| 47 | ($\eta^8$-cyclooctatetrenyl)($\eta^5$-cyclopentadienyl)chrome(III) hexafluorophosphate | TX-1 | 9 |
| 48 | ($\eta^8$-cyclooctatetrenyl)($\eta^5$-cyclopentadienyl)chrome(III) hexafluorophosphate | 1,1'-dicyano-4-(p-dimethylaminophenyl)-1,3-butadiene | 8 |

TABLE 8

| Comp. Example No. | Component (b) | Component (c) | Number of steps |
|---|---|---|---|
| 5 | ($\eta^6$-benzene)($\eta^5$-cyano-cyclopentadienyl)iron(II) hexafluorophosphate | none | 0 |
| 6 | ($\eta^6$-benzene)($\eta^5$-cyclopentadienyl)cobalt(II) hexafluorophosphate | none | 0 |
| 7 | bis($\eta^5$-chloropentadienyl)cyclopentadienyl)manganese (III) hexafluorophosphate | none | 0 |
| 8 | ($\eta^7$-cycloheptatrienyl)($\eta^5$-cyclopentadienyl)manganese (III) hexafluorophosphate | none | 0 |
| 9 | ($\eta^8$-cyclooctatetrenyl)($\eta^5$-cyclopentadienyl)chrome(III) hexafluorophosphate | none | 0 |
| 10 | none | 4-(p-diethylaminostyryl)-quinoline | 0 |
| 11 | none | TX-1 | 0 |
| 12 | none | 1,1'-dicyanol-4-(p-dimethylaminophenyl)-1,3-butadiene | 0 |

As is clear from Table 1 to Table 8, Examples 1 to 48 of the present invention have higher sensitivity to the light source of 490 nm in comparison with Comparative Examples 1 to 12.

Examples 49 to 78

According to the same manner as described in Example 1, each sensitivity test specimen was obtained except that the component (d) (3 parts) was further added. Test results are shown in Tables 9 to 11.

TABLE 9

| Example No. | Component (b) | Component (c) | Component (d) | Number of steps |
|---|---|---|---|---|
| 49 | ($\eta^6$-benzene)($\eta^5$-cyclopentadienyl)iron(II) hexafluorophosphate | 4-(p-diethylaminostyryl) quinoline | N-phenylglycine | 16 |
| 50 | ($\eta^6$-benzene)($\eta^5$-cyclopentadienyl)iron(II) hexafluorophosphate | 4-(p-diethylaminostyryl) quinoline | N-(p-methylphenyl) glycine | 15 |
| 51 | ($\eta^6$-benzene)($\eta^5$-cyclopentadienyl)iron(II) hexafluorophosphate | 4-(p-diethylaminostyryl) quinoline | N-(p-cyanophenyl) glycine | 18 |
| 52 | ($\eta^6$-benzene)($\eta^5$-cyclopentadienyl)iron(II) hexafluorophosphate | 4-(p-diethylaminostyryl) quinoline | 6-cyanoindoleacetic acid | 17 |
| 53 | ($\eta^6$-benzene)($\eta^5$-cyclopentadienyl)iron(II) hexafluorophosphate | 4-(p-diethylaminostyryl) quinoline | 5,5-dimethyl-1,3-cyclohexanedione | 14 |
| 54 | ($\eta^6$-benzene)($\eta^5$-cyclopentadienyl)iron(II) hexafluorophosphate | 4-(p-diethylaminostyryl) quinoline | 2-methyl-1,3-cyclohexanedione | 18 |
| 55 | ($\eta^6$-benzene)($\eta^5$-cyclopentadienyl)iron(II) hexafluorophosphate | 4-(p-diethylaminostyryl) quinoline | 2-methyl-1,3-cyclopentadione | 17 |
| 56 | ($\eta^6$-benzene)($\eta^5$-cyclopentadienyl)iron(II) hexafluorophosphate | 4-(p-diethylaminostyryl) quinoline | 1,3,5-trimethyl barbituric acid | 18 |
| 57 | ($\eta^6$-benzene)($\eta^5$-cyclopentadienyl)iron(II) hexafluorophosphate | 4-(p-diethylaminostyryl) quinoline | 1,3-indanedione | 16 |
| 58 | ($\eta^6$-benzene)($\eta^5$-cyclopentadienyl)iron(II) hexafluorophosphate | 4-(p-diethylaminostyryl) quinoline | 2-methyl-1,3-indanedione | 18 |

TABLE 10

| Example No. | Component (b) | Component (c) | Component (d) | Number of steps |
|---|---|---|---|---|
| 59 | ($\eta^6$-benzene)($\eta^5$-cyclopentadienyl)iron(II) hexafluorophosphate | 2,5-bis (4'-diethylamino-benzylidene) cyclopentanone | N-phenylglycine | 18 |
| 60 | ($\eta^6$-benzene)($\eta^5$-cyclopentadienyl)iron(II) hexafluorophosphate | 2,5-bis (4'-diethylamino-benzylidene) cyclopentanone | N-(p-methylphenyl) glycine | 17 |
| 61 | ($\eta^6$-benzene)($\eta^5$-cyclopentadienyl)iron(II) hexafluorophosphate | 2,5-bis (4'-diethylamino-benzylidene) cyclopentanone | N-(p-cyanophenyl) glycine | 20 |
| 62 | ($\eta^6$-benzene)($\eta^5$-cyclopentadienyl)iron(II) hexa- | 2,5-bis (4'-diethylamino-benzylidene) cyclopentanone | 6-cyanoindoleacetic acid | 19 |

TABLE 10-continued

| Example No. | Component (b) | Component (c) | Component (d) | Number of steps |
|---|---|---|---|---|
| 63 | ($\eta^6$-benzene)($\eta^5$-cyclopentadienyl)iron(II) hexafluorophosphate | 2,5-bis (4'-diethylaminobenzylidene) cyclopentanone | 5-5-dimethyl-1,3-cyclohexanedione | 16 |
| 64 | ($\eta^6$-benzene)($\eta^5$-cyclopentadienyl)iron(II) hexafluorophosphate | 2,5-bis (4'-diethylaminobenzylidene) cyclopentanone | 2-methyl-1,3-cyclohexanedione | 20 |
| 65 | ($\eta^6$-benzene)($\eta^5$-cyclopentadienyl)iron(II) hexafluorophosphate | 2,5-bis (4'-diethylaminobenzylidene) cyclopentanone | 2-methyl-1,3-cyclopentadione | 19 |
| 66 | ($\eta^6$-benzene)($\eta^5$-cyclopentadienyl)iron(II) hexafluorophosphate | 2,5-bis (4'-diethylaminobenzylidene) cyclopentanone | 1,3,5-trimethyl-barbituric acid | 20 |
| 67 | ($\eta^6$-benzene)($\eta^5$-cyclopentadienyl)iron(II) hexafluorophosphate | 2,5-bis (4'-diethylaminobenzylidene) cyclopentanone | 1,3-indanedione | 18 |
| 68 | ($\eta^6$-benzene)($\eta^5$-cyclopentadienyl)iron(II) hexafluorophosphate | 2,5-bis (4'-diethylaminobenzylidene) cyclopentanone | 2-methyl-1,3-indanedione | 20 |

TABLE 11

| Example No. | Component (b) | Component (c) | Component (d) | Number of steps |
|---|---|---|---|---|
| 69 | ($\eta^6$-benzene)($\eta^5$-cyclopentadienyl)iron(II) hexafluorophosphate | 7-diethylamino-3 (2-benzothiazyl) cumarin | N-phenylglycine | 18 |
| 70 | ($\eta^6$-benzene)($\eta^5$-cyclopentadienyl)iron(II) hexafluorophosphate | 3,3'-carbonylbis(7-diethylaminocumarin) | " | 18 |
| 71 | ($\eta^6$-benzene)($\eta^5$-cyclopentadienyl)iron(II) hexafluorophosphate | 4-(p-diethylaminostyryl pyridine | " | 15 |
| 72 | ($\eta^6$-benzene)($\eta^5$-cyclopentadienyl)iron(II) hexafluorophosphate | 2-(p-diethylaminostyryl) quinoline | " | 16 |
| 73 | ($\eta^6$-benzene)($\eta^5$-cyclopentadienyl)iron(II) hexafluorophosphate | 2,6-bis(4'-diethylaminobenzylidene)cyclohexanone | " | 18 |
| 74 | ($\eta^6$-benzene)($\eta^5$-cyclopentadienyl)iron(II) hexafluorophosphate | 2,5-bis (4'-N-ethyl-N-carbomethoxymethylaminobenzylidene) cyclopentanone | " | 18 |
| 75 | ($\eta^6$-benzene)($\eta^5$-cyanocyclopentadienyl)iron(II) hexafluorophosphate | 7-diethylamino-3-(2-benzimidazolyl) cumarin | " | 20 |
| 76 | ($\eta^6$-cyanobenzene)($\eta^5$-cyclopentadienyl)iron (II) hexafluorophosphate | 7-diethylamino-3-(2-benzimidazolyl) cumarin | " | 20 |
| 77 | ($\eta^6$-chlorobenzene)($\eta^5$-cyclopentadienyl)iron (II) hexafluorophosphate | 7-diethylamino-3-(2-benzimidazolyl) cumarin | " | 19 |
| 78 | ($\eta^6$-chlorobenzene)($\eta^5$-cyclopentadienyl)iron (II) hexafluorophosphate | 7-diethylamino-3-(2-benzimidazolyl) cumarin | " | 20 |

Examples 79 to 103 and Comparative Examples 13 to 20

According to the same manner as described in Example 1, each sensitivity test specimen was obtained except that TX-1 or the following TX-2, X-1 or X-2 was used instead of the component (c). Test results are shown in Tables 12 to 15.

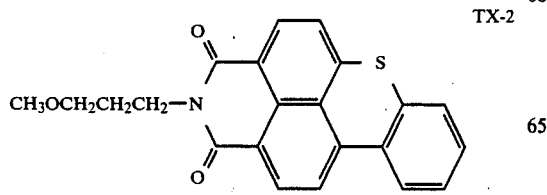

TX-2

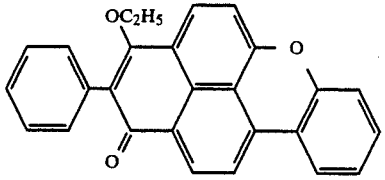

X-1

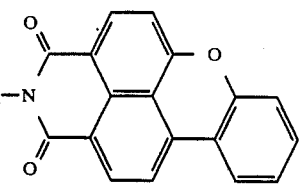

X-2

TABLE 12

| Example No. | Component (b) | Component (c) | Component (d) | Number of steps |
|---|---|---|---|---|
| 79 | ($\eta^6$-benzene)($\eta^5$-cyano-cyclopentadienyl)iron(II) hexafluorophosphate | TX-1 | none | 13 |
| 80 | ($\eta^6$-benzene)($\eta^5$-cyano-cyclopentadienyl)iron(II) hexafluorophosphate | TX-2 | " | 13 |
| 81 | ($\eta^6$-benzene)($\eta^5$-cyano-cyclopentadienyl)iron(II) hexafluorophosphate | X-1 | " | 13 |
| 82 | ($\eta^6$-benzene)($\eta^5$-cyano-cyclopentadienyl)iron(II) hexafluorophosphate | X-2 | " | 13 |
| 83 | ($\eta^6$-benzene)($\eta^5$-cyano-cyclopentadienyl)iron(II) hexafluorophosphate | TX-1 | " | 15 |
| 84 | ($\eta^6$-cyanobenzene)($\eta^5$-cyclopentadienyl)iron(II) hexafluorophosphate | " | " | 15 |
| 85 | ($\eta^6$-chlorobenzene)($\eta^5$-cyclopentadienyl)iron(II) hexafluorophosphate | " | " | 14 |
| 86 | ($\eta^6$-chlorobenzene)($\eta^5$-cyanocyclopentadienyl)iron(II) hexafluorophosphate | " | " | 15 |

TABLE 13

| Example No. | Component (b) | Component (c) | Component (d) | Number of steps |
|---|---|---|---|---|
| 87 | ($\eta^6$-benzene)($\eta^5$-cyclopentadienyl)iron(II) hexafluorophosphate | TX-1 | N-phenylglycine | 13 |
| 88 | ($\eta^6$-benzene)($\eta^5$-cyclopentadienyl)iron(II) hexafluorophosphate | " | N-(p-methylphenyl)glycine | 17 |
| 89 | ($\eta^6$-benzene)($\eta^5$-cyclopentadienyl)iron(II) hexafluorophosphate | " | N-(p-cyanophenyl)glycine | 14 |
| 90 | ($\eta^6$-benzene)($\eta^5$-cyclopentadienyl)iron(II) hexafluorophosphate | " | 6-cyanoindoleacetic acid | 15 |
| 91 | ($\eta^6$-benzene)($\eta^5$-cyclopentadienyl)iron(II) hexafluorophosphate | " | 5,5-dimethyl-1,3-cyclohexanedione | 17 |
| 92 | ($\eta^6$-benzene)($\eta^5$-cyclopentadienyl)iron(II) hexafluorophosphate | " | 2-methyl-1,3-cyclohexanedione | 18 |
| 93 | ($\eta^6$-benzene)($\eta^5$-cyclopentadienyl)iron(II) hexafluorophosphate | " | 2-methyl-1,3-cyclopentanedione | 19 |
| 94 | ($\eta^6$-benzene)($\eta^5$-cyclopentadienyl)iron(II) hexafluorophosphate | " | 1,3,5-trimethylbarbituric acid | 19 |
| 95 | ($\eta^6$-benzene)($\eta^5$-cyclopentadienyl)iron(II) hexafluorophosphate | " | 1,3-indanedione | 18 |
| 96 | ($\eta^6$-benzene)($\eta^5$-cyclopentadienyl)iron(II) hexafluorophosphate | " | 2-methyl-1,3-indanedione | 19 |

TABLE 14

| Example No. | Component (b) | Component (c) | Component (d) | Number of steps |
|---|---|---|---|---|
| 97 | ($\eta^6$-benzene)($\eta^5$-cyclopentadienyl)iron(II) hexafluorophosphate | TX-2 | N-phenylglycine | 13 |
| 98 | ($\eta^6$-benzene)($\eta^5$-cyclopentadienyl)iron(II) hexafluorophosphate | X-1 | " | 17 |
| 99 | ($\eta^6$-benzene)($\eta^5$-cyclopentadienyl)iron(II) hexafluorophosphate | X-2 | " | 17 |
| 100 | ($\eta^6$-benzene)($\eta^5$-cyano-cyclopentadienyl)iron(II) hexafluorophosphate | TX-1 | " | 19 |
| 101 | ($\eta^6$-benzene)($\eta^5$-cyclopentadienyl)iron(II) hexafluorophosphate | " | " | 19 |
| 102 | ($\eta^6$-chlorobenzene)($\eta^5$- | " | " | 18 |

TABLE 14-continued

| Example No. | Component (b) | Component (c) | Component (d) | Number of steps |
|---|---|---|---|---|
| 103 | cyclopentadienyl)iron(II) hexafluorophosphate ($\eta^6$-chlorobenzene)($\eta^5$-cyanocyclopentadienyl) iron (II) hexafluorophosphate | " | " | 19 |

TABLE 15

| Comp. Example No. | Component (b) | Component (c) | Component (d) | Number of steps |
|---|---|---|---|---|
| 13 | ($\eta^6$-benzene)($\eta^5$-cyclopentadienyl)iron(II) hexafluorophosphate | none | none | 0 |
| 14 | ($\eta^6$-benzene)($\eta^5$-cyclopentadienyl)iron(II) hexafluorophosphate | none | N-phenylglycine | 13 |
| 15 | ($\eta^6$-benzene)($\eta^5$-cyclopentadienyl)iron(II) hexafluorophosphate | none | none | 0 |
| 16 | none | TX-1 | none | 0 |
| 17 | none | TX-1 | N-phenylglycine | 9 |
| 18 | none | TX-1 | 2-methyl-1,3-cyclohexanedione | 8 |
| 19 | none | none | N-phenylglycine | 0 |
| 20 | none | none | 2-methyl-1,3-cyclohexanedione | 0 |

What is claimed is:

1. A photopolymerizable composition which
   (a) at least one ethylenic unsaturated compound which is non-gaseous at room temperature;
   (b) at least one metallic arene compound of the general formula (I):

$$[R^1)(R^2M)]^{m+} Y^{n-} \quad (I)$$

wherein m and n are an integer of 1 or 2, $R^1$ is $\pi$-arene, $R^2$ is $\pi$-arene or an anion of $\pi$-arene, M is a monovalent to trivalent metallic cation of the IVb to VIIb group, VIII group or Ib group of the periodic table, and Y is an anion selected from the group consisting of $BF_4^-$, $PF_6^-$, $AsF_6^-$, $SbF_6^-$, $FeCl_4^-$, $SnCl_6^-$, $SbCl_6^-$ and $BiCl_6^-$; and (c) at least one compound selected from the group consisting of a p aminophenyl unsaturated ketone compound of the general formula (II):

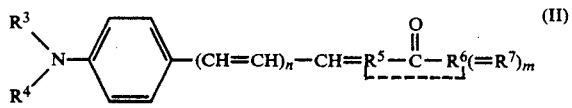

wherein m and n are 0 or 1, $R^3$ and $R^4$ are a hydrogen atom or an alkyl group having 1 to 6 carbon atoms, or $CH_2COOR^8$ in which $R^8$ is a hydrogen atom or an alkyl group having 1 to 6 carbon atoms, an alkaline metal, ammonium or an amine, or $C_2H_4CF_3$, $C_2H_4I$, $C_2H_4Br$, $C_2H_4Cl$, $C_2H_4F$, $C_2H_4CN$ or $C_2H_4NO_2$, $R^5$ is methylidine or an alkylene-iridin group having 1 to 6 carbon atoms which can combine with $R^6$ and form a ring together with the carbonyl group, $R^6$ is carbon atom, a phenyl group optionally substituted by an amino, N-alkylamino having to 6 carbon atoms, N,N-dialkylamino having 1 to 6 carbon atoms, hydroxy, alkoxy having 1 to 6 carbon atoms, alkylthio having 1 to 6 carbon atoms, aryl hydrocarbon having 6 to 14 carbon atoms or mercapto, or a group which forms indanone or tetralone together with $R^5$ and the carbonyl group, and $R^7$ is:

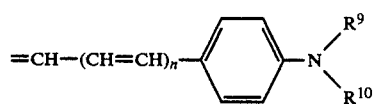

wherein n is 0 or 1, $R^9$ and $R^{10}$ are a hydrogen atom or an alkyl group having 1 to 6 carbon atoms or $CH_2COOR^{11}$ wherein $R^{11}$ is a hydrogen atom, an alkyl group having 1 to 6 carbon atoms, an alkaline metal, ammonium, or an amine, or $C_2H_4CF_3$, $C_2H_4I$, $C_2H_4Br$, $C_2H_4Cl$, $C_2H_4F$, $C_2H_4CN$ or $C_2H_4NO_2$, a pyridine derivative of the general formula (III):

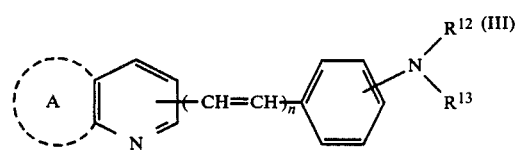

wherein, n is 1 or 2, $R^{12}$ and $R^{13}$ are an alkyl group having 1to 6 carbon atoms and A is an optionally aryl present group which can be condensed to the pyridine ring to form aquinoline ring, or a salt thereof, and a xanthene or thioxanthene compound of the general formula (IV):

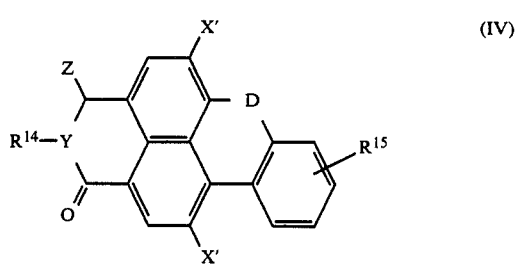

wherein D is an oxygen atom or a sulfur atom, X' is a hydrogen atom or a halogen atom, Y is a carbon atom or a nitrogen atom, provided that, when Y is a carbon atom, Y is bonded to the adjacent carbon atom through a double bonding indicated by a dotted line in formula (IV), and, when Y is a nitrogen atom, Y is bonded to the adjacent carbon atom through a single bond, Z is an oxygen atom which is bonded to the adjacent carbon atom through a double bond, an alkoxy group having 1 to 6 carbon atoms or an alkanoyloxy group having 1 to 6 carbon atoms, $R^{14}$ is an alkyl group having 1 to 6 carbon atoms, a hydroxyalkyl group having 1 to 6 carbon atoms, an alkoxyalkyl group having 2 to 12 carbon atoms, a dialkylaminoalkyl group having 3 to 18 carbon atoms, or an aryl hydrocarbon group of 6 to 14 carbon atoms optionally substituted with alkyl groups of 1 to 4 carbon atoms, and $R^{15}$ is a hydrogen atom, an alkoxy group having 1 to 6 carbon atoms, an alkyl group having 1 to 6 carbon atoms or a dialkylamino group having 1 to 6 carbon atoms.

2. A photopolymerizable composition according to claim 1, wherein the composition contains 0.01 to 50 parts by weight of the component (b) and 0.01 to 20 parts by weight of the component (c) per 100 parts by weight of the component (a).

3. A photopolymerizable composition according to claim 1, wherein the composition further includes:
(d) at least one compound selected from the group consisting of a compound of the general formula (V):

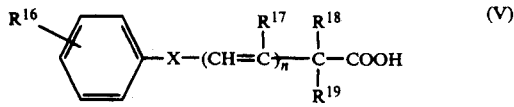

wherein $R^{16}$, $R^{18}$ and $R^{19}$ are the same or different and are hydrogen, an alkyl having 1 to 6 carbon atoms, an alkoxy group having 1 to 6 carbon atoms, cyano, carboxylic acid, ester wherein the alkyl group has 1-4 carbon atoms, carboxylic acid alkyl amide wherein the alkyl group has 1 to 4 carbon atoms, nitro or halogen or $R^{16}$ can form a condensed polycyclic group together with the benzene ring, X is S, Se or N-$R^{20}$, $R^{20}$ is hydrogen, an alkyl group having 1 to 6 carbon atoms, $R^{17}$ is hydrogen, an alkyl having 1 to 6 carbon atoms or phenyl or $R^{17}$—(CH=C)$_n$—X— can form a 5 membered ring condensed to the benzene ring, and n is 0 or 1, and a cyclic diketone compound of the general formula

wherein $R^{21}$ is hydrogen, a substituted or unsubstituted alkyl group having 1 to 12 carbon atoms or an aralkyl group having 7 to 20 carbon atoms, the aryl moiety of which has 6 to 10 carbon atoms optionally substituted with an alkyl of 1 to 4 carbon atoms and the alkyl moiety of which has 1 to 10 carbon atoms and G is a bivalent organic group.

4. A photopolymerizable composition according to claim 3, wherein the composition contains 0.01 to 20 parts by weight of the component (d) per 100 parts by weight of the component (a).

5. A photopolymerizable composition according to claim 1, wherein the composition further includes 0 to 1000 parts by weight of a thermoplastic polymeric organic binder per 100 parts by weight of the component (a).

* * * * *